(12) United States Patent
Hekmatshoartabari et al.

(10) Patent No.: US 11,461,645 B2
(45) Date of Patent: Oct. 4, 2022

(54) INITIALIZATION OF MEMORY NETWORKS

(71) Applicant: International Business Machines Corporation, Armonk, NY (US)

(72) Inventors: Bahman Hekmatshoartabari, White Plains, NY (US); Ravi Nair, Briarcliff Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 518 days.

(21) Appl. No.: 16/699,814

(22) Filed: Dec. 2, 2019

(65) Prior Publication Data

US 2021/0166116 A1 Jun. 3, 2021

(51) Int. Cl.
*G06N 3/04* (2006.01)
*G06N 3/08* (2006.01)
*G06N 3/063* (2006.01)

(52) U.S. Cl.
CPC .............. *G06N 3/08* (2013.01); *G06N 3/04* (2013.01); *G06N 3/0445* (2013.01); *G06N 3/063* (2013.01)

(58) Field of Classification Search
CPC .......... G06N 3/08; G06N 3/04; G06N 3/0445; G06N 3/063; G11C 7/20
USPC .......................................................... 706/25
See application file for complete search history.

(56) References Cited

U.S. PATENT DOCUMENTS

| | | |
|---|---|---|
| 9,536,190 B2 | 1/2017 | Sarah et al. |
| 9,607,265 B2 | 3/2017 | Jin et al. |
| 10,192,146 B2 | 1/2019 | Sen et al. |
| 2017/0228638 A1 | 8/2017 | Danihelka et al. |
| 2018/0046900 A1* | 2/2018 | Dally .................. G06F 9/30018 |
| 2018/0046916 A1* | 2/2018 | Dally ...................... G06N 3/063 |
| 2018/0075338 A1 | 3/2018 | Gokmen |
| 2018/0174042 A1 | 6/2018 | Srinivasa et al. |
| 2018/0349313 A1 | 12/2018 | Ahn et al. |
| 2019/0325291 A1 | 10/2019 | Gokmen et al. |

FOREIGN PATENT DOCUMENTS

| | | | | |
|---|---|---|---|---|
| CA | 2839279 A1 * | 12/2012 | ........... | G05B 13/024 |
| CA | 3056098 A1 * | 11/2019 | ........... | G06N 3/0454 |
| EP | 3367309 A1 | 8/2018 | | |
| WO | WO-2019111118 A1 * | 6/2019 | ............... | G06N 3/04 |
| WO | WO-2021111245 A1 * | 6/2021 | ............... | G06N 3/04 |

OTHER PUBLICATIONS

International Search Report dated Mar. 9, 2021 issued in PCT/IB2020/061078, 9 pages.

(Continued)

*Primary Examiner* — Ly D Pham
(74) *Attorney, Agent, or Firm* — Scully, Scott, Murphy & Presser, P.C.; Daniel P. Morris

(57) ABSTRACT

A memory network can be constructed with at least memory write weightings, memory read weightings and at least one read vector, the memory write weightings parameterizing memory write operations of a neural network to the memory matrix, the memory read weightings parameterizing memory read operations of the neural network from the memory matrix. At least one of the write weightings, the read weightings, or elements of the at least one read vector, can be initialized to have sparsity and/or low discrepancy sampling pattern. The memory network can be trained to perform a task.

20 Claims, 8 Drawing Sheets

(56) References Cited

OTHER PUBLICATIONS

Yam, J.Y.F., et al., "A weight initialization method for improving training speed in feed-forward neural network", Neurocomputing 30 (2000), Received Apr. 3, 1998, Accepted Mar. 22, 1999, pp. 219-232.

NIST, "NIST Cloud Computing Program", http://csrc.nist.gov/groups/SNS/cloud-computing/index.html, Created Dec. 1, 2016, Updated Oct. 6, 2017, 9 pages.

Graves, A., et al., "Neural Turing Machines", https://arxiv.org/pdf/1410.5401.pdf. Submitted on Oct. 20, 2014 (v1), last revised Dec. 10, 2014 (v2), Accessed Dec. 2, 2019, 26 pages.

Graves, A., et al., "Hybrid computing using a neural network with dynamic external memory", https://doi.org/10.1038/nature20101, Published Oct. 12, 2016, Accessed Dec. 2, 2019, 2 pages.

Rae, J.W., et al., "Scaling Memory-Augmented Neural Networks with Sparse Reads and Writes", Submitted on Oct. 27, 2016, Accessed Dec. 2, 2019, 17 pages.

Wu, Y., et al., "The Kanerva Machine: A Generative Distributed Memory", https://arxiv.org/abs/1804.01756, Jun. 18, 2018, Accessed Dec. 2, 2019, 16 pages.

Wikipedia, "Neural Turing machine", https://en.wikipedia.org/wiki/Neural_Turing_machine, Last edited on Aug. 2, 2019, Accessed Dec. 2, 2019, 2 pages.

Collier, M., et al., "Implementing Neural Turing Machines", https://doi.org/10.1007/978-3-030-01424-7_10, First Online Sep. 27, 2018, Accessed on Dec. 2, 2019, 4 pages, Abstract only.

Wikipedia, "Low-discrepancy sequence", https://en.wikipedia.org/wiki/Low-discrepancy_sequence, Last edited Oct. 11, 2019, Accessed on Dec. 2, 2019, 7 pages.

Wikipedia, "Sobol sequence", https://en.wikipedia.org/wiki/Sobol_sequence, Last edited Oct. 14, 2019, Accessed on Dec. 2, 2019, 6 pages.

* cited by examiner

```
>>> import sobol_seq
>>> sobol_seq.i4_sobol_generate(40,127)*128
array([[ 64.,  64.,  64.,  64.,  64.,  64.,  64.,  64.,  64.,  64.,  64.,
         64.,  64.,  64.,  64.,  64.,  64.,  64.,  64.,  64.,  64.,  64.,
         64.,  64.,  64.,  64.,  64.,  64.,  64.,  64.,  64.,  64.,  64.,
         64.,  64.,  64.,  64.,  64.,  64.,  64.],
       [ 96.,  32.,  96.,  32.,  96.,  32.,  96.,  32.,  96.,  32.,  96.,
         32.,  96.,  32.,  96.,  32.,  96.,  32.,  96.,  32.,  96.,  32.,
         96.,  32.,  96.,  32.,  96.,  32.,  96.,  32.,  96.,  32.,  96.,
         32.,  96.,  32.,  96.,  32.,  96.,  32.],
       ...
       [ 97., 117.,  35., 121.,  77.,  75.,  24.,  88., 120.,  56.],
       [ 65.,  21.,   3.,  25., 109.,  43.,  44.,  60., 124.,  92.],
       [  1.,  85.,  67.,  89.,  45., 107.,  68.,   4.,   0.,  70.],
       ...
>>> sobol_seq.i4_sobol_generate(40,127)[:,0]*128
array([[ 64.,  96.,  32.,  48.,  80.,  16., 112.,  24.,  88., 120.,  56.],
       [ 40., 104.,  72.,   8., 100.,  76.,  12., 108.,  44.,  60., 124.,  92.],
       [ 28.,  20.,  84., 116.,  52.,  36., 100.,  68.,   4., 126.,  62.,  70.],
       [102.,  38.,  54., 118.,  86.,  22.,  30.,  94., 126., 122.,  90.,  46.],
       [110.,  78.,  10.,  74., 106.,  42.,  58.,   2.,   3.,  67.,  26.],
       [ 18.,  82., 114.,  50.,  34.,  98.,  66., 123.,  59.,  43.,  99.],
       [ 35.,  51., 115.,  83.,  19.,  27.,  91., 127.,   5.,  95.,  31., 107.],
       [ 75.,  11.,  15.,  79., 111.,  47.,  63.,   7.,  61.,  69.,  45., 101.,  23.],
       [ 87., 119.,  55.,  39., 103.,  71., 125., 121.,  89.,  25.,  37.],
       [ 53., 117.,  85.,  21.,  29.,  93.,  57.,  41.,  17.,  77.],
       [ 13.,   9.,  73., 105.,  65.,  1., 1.)],
       [113.,  49.,  33.,  97.])
```

FIG. 4

INITIALIZATION OF MEMORY NETWORKS

BACKGROUND

The present application relates generally to computers and computer applications, and more particularly to machine learning and machine learning systems coupled with a memory component.

Memory networks such as neural Turing machines (NTMs), memory-augmented neural networks (MANNs), differentiable neural computers (DNCs), and others can couple an artificial neural network to an external memory. The coupling can allow memory networks to outperform recurrent neural networks (RNNs) such as long short-term memories (LSTMs) in tasks that require learning complicated data transformations over long periods of time, e.g., copying, sorting, associative recall and few-shot learning. However, training of these memory networks is not straightforward and the existing approaches are not reliable. For example, the training can often collapse reading and writing into single memory slots. Training of the memory networks with existing approaches can be very slow to converge.

BRIEF SUMMARY

Computer-implemented method, system and computer program product for training a memory network can be provided. A method, in one aspect, includes constructing a memory network with at least memory write weightings, memory read weightings and at least one read vector. The memory write weightings parameterize memory write operations of a neural network to an external memory component of the memory network. The memory read weightings parameterize memory read operations of the neural network from the external memory component of the memory network. The method also includes initializing at least one selected from the group of at least the write weightings, the read weightings, and elements of the at least one read vector, to have sparsity. The method further includes training the memory network with one selected from the group of at least the write weightings, the read weightings and elements of at least one read vector, initialized to have sparse characteristic. The training updates the write weightings, the read weightings and at least one read vector.

In another aspect, a computer-implemented method of training a memory network may include constructing a memory network with at least memory write weightings, memory read weightings and at least one read vector. The memory write weightings parameterize memory write operations of a neural network to an external memory component of the memory network. The memory read weightings parameterize memory read operations of the neural network from the external memory component of the memory network. The method may also include initializing at least one selected from the group of at least the write weightings, the read weightings and elements of the at least one read vector, to a configured value following a low discrepancy sequence. The method may also include training the memory network with one selected from the group of at least the write weightings, the read weightings and elements of at least one read vector, with initial configured values that follow a low discrepancy sequence. The training updates the write weightings, the read weightings and at least one read vector.

A system for training a memory network, in one aspect, may include a hardware processor and a memory device coupled with the hardware processor. The memory device stores a memory matrix. The hardware processor can be configured to construct a memory network with at least memory write weightings, memory read weightings and at least one read vector. The memory write weightings parameterize memory write operations of a neural network to the memory matrix. The memory read weightings parameterize memory read operations of the neural network from the memory matrix. The hardware processor can be also configured to initialize at least one selected from the group of at least the write weightings, the read weightings and elements of at least one read vector, to have sparsity. The hardware processor can be also configured to train the memory network with one selected from the group of at least the write weightings, the read weightings and at least one read vector, initialized to have a sparse characteristic. The training updates the write weightings, the read weightings and at least one read vector.

A computer readable storage medium storing a program of instructions executable by a machine to perform one or more methods described herein also may be provided.

Further features as well as the structure and operation of various embodiments are described in detail below with reference to the accompanying drawings. In the drawings, like reference numbers indicate identical or functionally similar elements.

BRIEF DESCRIPTION OF THE DRAWINGS

FIG. 4 shows an example of generating Sobol sequences using a computer program as an example method of generating a low-discrepancy sequence in one embodiment.

DETAILED DESCRIPTION

Figure 1:
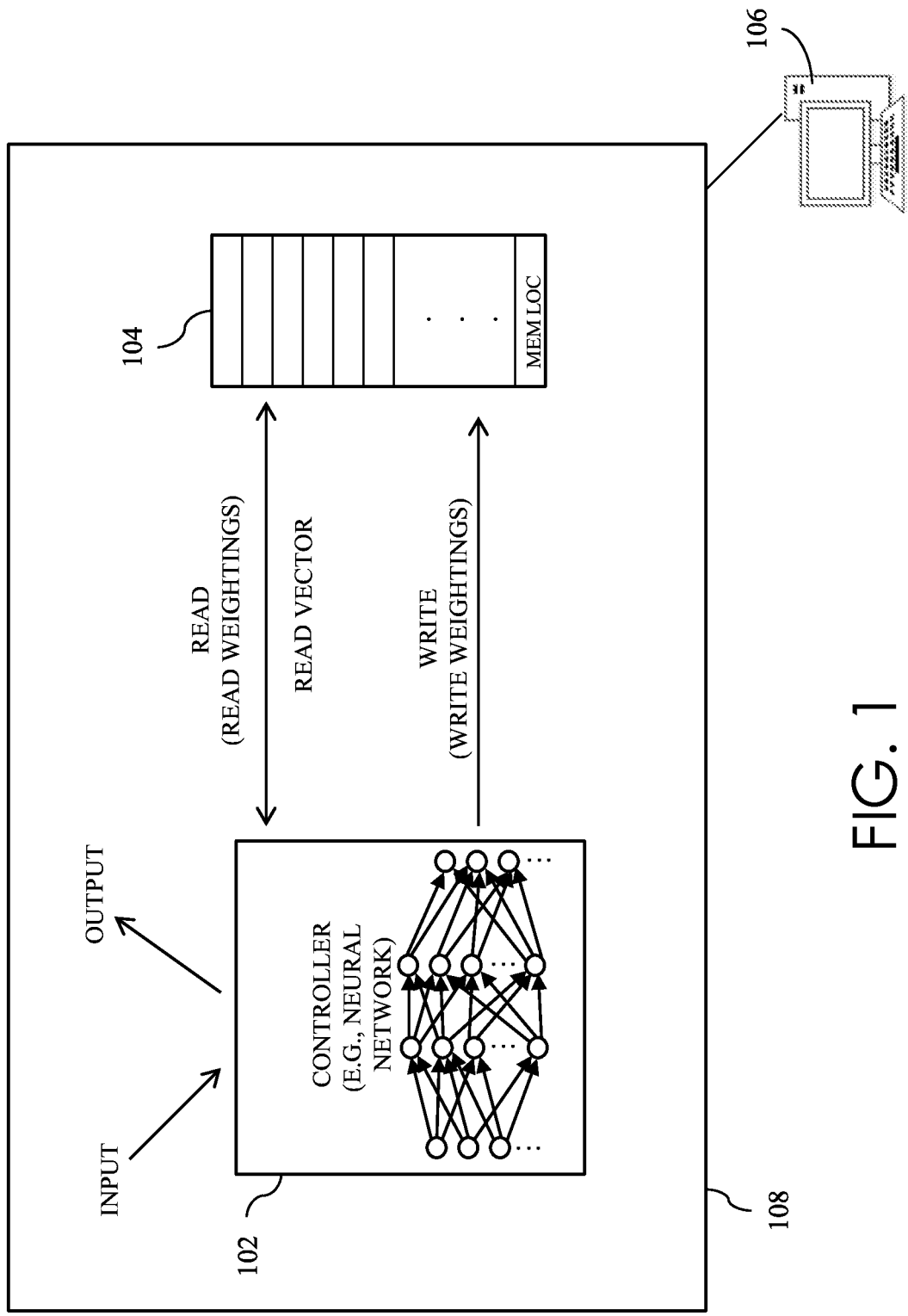
FIG. 1 is a diagram illustrating components of a system in one embodiment.

Systems, methods, and techniques can be provided, which allow for fast and reliable initialization of the memory networks. A system, for example, may include a computer system. A method, for example, may include a computer-implemented method. A memory network combines a machine learning model such as an artificial neural network with a memory component that can be read from and written to. In a memory network, a machine learning model can be trained to operate with the memory component. A weight is a parameter in a machine learning model. Training a model in machine learning involves learning or estimating weights (e.g., among others parameters), for example, by gradient descent backpropagation or another technique.

In an embodiment, a system initializes such memory network's memory write weightings, read weightings and/or read vectors with sparse values, for instance, one or only a few non-zero elements, e.g., instead of small pseudo-random values for many or all elements. In an embodiment, the system also uses low-discrepancy sequences to generate such sparse initializations (e.g., instead of pseudo-random sequences). Examples of low-discrepancy sequences include but are not limited to Sobol, Halton, Hammersley, and van der Corput sequences.

An artificial neural network (ANN) is also referred to as a neural network herein. An embodiment of an implementation of an artificial neural network can include a succession of layers of neurons, which are interconnected so that output signals of neurons in one layer are weighted and transmitted to neurons in the next layer. A neuron Ni in a given layer may be connected to one or more neurons Nj in the next layer, and different weights wij can be associated with each neuron-neuron connection Ni-Nj for weighting signals transmitted from Ni to Nj. A neuron Nj generates output signals dependent on its accumulated inputs, and weighted signals can be propagated over successive layers of the network from an input to an output neuron layer. An artificial neural network machine learning model can undergo a training phase in which the sets of weights associated with respective neuron layers are determined. The network is exposed to a set of training data, in an iterative training scheme in which the weights are repeatedly updated as the network "learns" from the training data. The resulting trained model, with weights defined via the training operation, can be applied to perform a task based on new data.

A memory network includes a controller and a memory component. The controller can be a neural network, for example, with a state such as, but not limited to, a long short term memory (LSTM). A controller also can be another network such as a feed-forward network. The controller can access the memory with read and write operations, which can be parameterized with weights. The network outputs that parameterize the read and write operations with weights are referred to as heads. For example, write weighting defines the degree to which a write head writes to a memory location; a read weighting defines the degree to which a read head reads from a memory location. A read vector returned by a read head is a combination of the memory matrix and a read weighting vector (e.g., a weighted sum of the memory vectors). The number of read and write heads can be configured, for example, based on a memory network's architecture, with at least one read head and one write head. Training the memory network includes learning the memory network's memory write weights, read weights and read vectors. The memory state of the memory network may be defined as a combination (e.g., concatenation) of the read weightings, write weightings, read vectors and the memory matrix. Depending on the architecture of the memory network, additional parameters including but not limited to, such as, usage vectors, precedence weightings and a link matrix may be defined and included in the memory state.

Access mechanisms to external memory can include content-based addressing and location-based addressing, which can provide memory addresses or cells to store or retrieve information. The controller's state such as read and write weights and other system parameters associated with memory access are trainable. Training of the weights can consider factors such as the current input (e.g., content addressing by similarity), previous focus (interpolation), possible shifting of focus (convolutional shift) and blurring (sharpening). A process in training the memory network initializes those weights and vectors, which are updated through the learning process until the error converges, for example, to a minimum accepted value or another criterion.

The systems, methods and techniques in embodiments provide for weight and/or vector initialization technique which can allow for efficient and faster convergence, thus more efficient and faster memory network model learning.

An embodiment of a system described herein initializes the write weightings, read weightings, and/or read vectors with sparse values, in training a memory network. Write weightings or weights parameterize memory cells to which information is stored. Read weightings or weights parameterize memory cells from which information is read.

As an example, the system initializes write weightings with a single randomly selected weight per write head initialized to 1, and all other weights initialized to 0. The system initializes all read weightings, read vectors, and the memory matrix to 0. An experiment performed with simulation parameters (e.g., 100 LSTM units, 128×20 memory matrix, training sequence lengths 1-20, batch size 1 (epoch number=sequence number), 1 read head, and 1 write head) shows that approximately 80% of training attempts converge very fast (e.g., 12-30 minutes on Intel® Core i7-5600U central processing unit (CPU) at 2.6 Ghz with AVX2 (SIMD) support for TensorFlow software).

In an embodiment, the system uses low-discrepancy sequences to generate such sparse initializations. A low-discrepancy sequence is a sequence with the property that for all values of N, its subsequence x1, . . . , xN has a low discrepancy. Low-discrepancy sequences are also called quasi-random or sub-random sequences. For a finite number of points, a low-discrepancy sequence covers the space more uniformly than a pseudo-random sequence. For example, a low-discrepancy sequence has more even distribution or higher degree of equidistribution than pseudo-random sequence. Examples include but are not limited to Sobol, Halton, Hammersley, and van der Corput sequences.

For example, the system in an embodiment selects or picks the sparse initial values from a low-discrepancy sequence. A simulation experiment performed in which a single write weight is pulled from a (40, 127) Sobol sequence initialized to 1, other write weights initialized to 0, read weights, read vectors, and the memory matrix all initialized to 0, shows that all training attempts (e.g., 15 runs) converge faster, e.g., within 12-30 minutes, using example simulation parameters of 100 LSTM units, 127×20 memory matrix, training sequence lengths 1-20, batch size=1 (therefore Epoch Number=Sequence Number), 1 read head and 1 write head. An observation from the experiment shows that a memory network trained on sequence lengths between 1 and 20 generalizes well to never-before seen sequences of length 40, 80 and 120.

The example below illustrates a possible way of implementing the method in one embodiment. This example is not meant to be restrictive. Rather, it is only provided by way of example and for illustration purposes. The example code is written in Python, but can be written in any other programming language as well. The line numbers do not correspond to actual line numbers in the code; and are only provided for ease of reference in the description below.

```
1   [block of code]
2   seq_wrap = int(1+iterations*batch_size*write_heads/mem_words/sobol_len)
3   mem_seed = sobol_seq.i4_sobol_generate(sobol_len, mem_words)*(1+mem_words)
4   mem_seed = numpy.reshape(numpy.transpose(mem_seed), (1, mem_words*sobol_len))
5   mem_seed = numpy.reshape(numpy.repeat(mem_seed, seq_wrap, axis=0), (1,
        mem_words*sobol_len*seq_wrap))
6   [block of code]
7   for count in range(1, iterations+1):
8       [block of code]
9       write_weightings = numpy.zeros([batch_size, mem_words, write_heads],
            dtype=numpy.float32)
10      for i in range(batch_size):
11          for j in range(write_heads):
12              write_weightings[i][int(mem_seed[0][(count-1)*batch_size*write_heads+i])-1][j] = 1
13      read_weightings = numpy.zeros([batch_size, mem_words, read_heads],
            dtype=numpy.float32)
14      memory_matrix = numpy.zeros([batch_size, mem_words, mem_width],
            dtype=numpy.float32)
15      read_vectors = numpy.zeros([batch_size, mem_width, read_heads], dtype=numpy.float32)
16      [block of code]
```

In line #2, "seq_wrap" is a variable representing the number of times the generated Sobol sequences are repeated (wrapped around) to generate a longer sequence. Since the number and length of the generated Sobol sequences are limited, and the total length of the concatenated sequence is much smaller than the number of iterations used in the training of the neural networks, one possible way of providing a larger sequence is to repeat the generated sequences. "iterations" represents the number of iterations used for training. "batch_size" represents the batch size used for training. "write_heads" represents the number of write heads. "mem_words" represents the number of memory words (e.g, in N×M memory matrix, the size of N, where N represents the number of memory locations). "sobol_len" represents the number of the generated Sobol sequences. The parameters, batch_size, write_heads, and mem_words are configurable parameters in memory network architecture.

In line #3, Sobol sequences of number "sobol_len" and length "mem_words" are generated and stored in "mem_seed" as an array having "mem_words" rows and "sobol_len" columns. For example, mem_words=127, sobol_len=40, and mem_seed=[[64, 96, 32, 48, ..., 65, 1], [64, 32, 96, 48, ..., 21, 85], ..., [64, 32, 96, 80, ..., 43, 107]] is a 127×40 array, representing 40 Sobol sequences of length 127 each (i.e., having 127×40=5080 elements in total).

In line #4, the array stored in "mem_seed" is reshaped as an array having 1 row and "mem_words*sobol_len" columns (equivalent to a row vector of length "mem_words*sobol_len") and the result is stored in "mem_seed". For example if mem_seed=[[64, 96, 32, 48, ..., 65, 1], [64, 32, 96, 48, ..., 21, 85], ..., [64, 32, 96, 80, ..., 43, 107]] prior to the execution of line #4, then mem_seed=[64, 96, 32, 48, ..., 65, 1, 64, 32, 96, 48, ..., 21, 85, ..., 64, 32, 96, 80, ..., 43, 107] after the execution of line #4.

In line #5, the array stored in "mem_seed" is repeated along its first axis (e.g., row) "seq_wrap" times, resulting in an array having 1 row and "mem_words*sobol_len*seq_wrap" columns which is stored in "mem_seed". As an illustrative example, if seq_wrap=2 (note "seq_wrap" can be much larger than 2) and mem_seed=[64, 96, 32, 48, ..., 43, 107] prior to the execution of line #5, then mem_seed=[64, 96, 32, 48, ..., 43, 107, 64, 96, 32, 48, ..., 43, 107] after the execution of line #5.

In line #7, looping over training iterations is started. "count" represents the current iteration (e.g., the current loop level starting from 1).

In line #9, "write_weightings" is a 3-dimensional array of size "batch_size", "mem_words", "write_heads" for the first, second and third dimensions respectively, and represents the write weightings. All elements of "write_weightings" are set to zeros. "float.32" represents 32-bit floating point (also known as single-precision) numerical format. Other numerical formats (including but not limited to 16-bit floating point) may be used as well.

In line #10-12, some elements of the "write_weightings" are set to 1 as determined by the sequence stored in "mem_seeds", while the rest remain 0. For example, if mem_seeds=[64, 96, 32, 48, 112, 80, 16, 24, 88, 120, 56, 40, 104, 72, ..., 43, 107], batch_size=3 and write_heads=2, for the first training iteration (e.g., count=1):
    write_weightings[0][63][0]=1
    write_weightings[0][95][1]=1
    write_weightings[1][31][0]=1
    write_weightings[1][47][1]=1
    write_weightings[2][111][0]=1
    write_weightings[2][79][1]=1
while other elements of the write_weightings remain zero. Similarly, for the second training iteration (e.g., count=2):
    write_weightings[0][15][0]=1
    write_weightings[0][23][1]=1
    write_weightings[1][87][0]=1
    write_weightings[1][119][1]=1
    write_weightings[2][55][0]=1
    write_weightings[2][39][1]=1
and so on.

In line #13, "read_weightings" is a 3-dimensional array of size "batch_size", "mem_words", "read_heads" for the first, second and third dimensions respectively, and represents the read weightings. All elements of "read_weightings" are set to zeros. "read_heads" represents the number of read heads.

In line #14, "memory_matrix" is a 3-dimensional array of size "batch_size", "mem_words", "mem_width" for the first, second and third dimensions respectively, and represents the memory matrix. All elements of "memory_matrix" are set to zeros. "mem_width" represents the memory width (e.g., in an N×M memory matrix, the size of M, a vector size at a memory location).

In line #15: "read_vectors" is a 3-dimensional array of size "batch_size", "mem_width", "read_heads" for the first, second and third dimensions respectively, and represents the read vectors. All elements of "read_vectors" are set to zeros.

Line #16 represents the following parts of the code (not shown), in which training for each iteration is performed using the write weightings, read weightings, memory matrix and read vectors initialized for that iteration as described above.

In the above example, the write weightings are initialized as a sparse array following the pattern of a low-discrepancy sequence (Sobol sequence in this example) as described. In an embodiment, sparsity and low discrepancy can be both utilized. In another embodiment, sparsity and low discrepancy can be implemented as two separate features. For example, if in line #9, write weightings are initialized as small random numbers instead of zeros, and some elements of the write weightings are set to 1 as described in lines #10-12, the resulting write weightings may not be sparse but still have the low-discrepancy characteristic as the write weightings that are set to 1 follow the pattern of a low-discrepancy sequence.

In another example, the write weightings are initialized to zeros as in line #9 above, but instead of setting some elements of the write weighting to 1 based on a low-discrepancy sequence as in lines #10-12, the write weighting are randomly set to 1. The resulting write weightings may not have a low-discrepancy characteristic, but still be sparse.

In the above example, in line #12, exactly one element of a given set of write weightings is set to 1. In other examples, a larger number, for example 2 or more elements of a given set may be set to 1.

In the above example, in line #12, some elements of the write weightings are set to 1. In other examples, these elements may be set to different non-zero values, for example, 0.5, 2 or 5, or another value.

In the above example, write weightings are initialized as sparse and low-discrepancy arrays, while read weightings and read vectors are initialized to zeros. In another example, read weightings may be initialized as sparse and low-discrepancy arrays, while write weightings and read vectors are initialized to zeros. For example, in an embodiment, at least one of the write weightings, read weightings and read vectors can be initialized as sparse and/or low-discrepancy arrays.

In the above example, in lines #2-5, the generated low-discrepancy sequences are flattened (i.e., converted from a 2-dimensional array to a 1-dimensional array, i.e., a vector) and wrapped (i.e., repeated for a desired number of times). The resulting sequence is subsequently used as a template for setting elements of the write weightings to 1 as described above. In various embodiments, various other arrangements may be used. For example, a concatenation of low-discrepancy sequences wherein a given low-discrepancy sequence appears a random number of times at random locations within the concatenated low-discrepancy sequence of a desired length may also be used. In another example, a 1-dimensional array (i.e., vector) of low-discrepancy sequences, such as the one generated in line #4 can be provided. Then at the start of a training iteration for each of the training iterations, a random element of the vector can be chosen and assumed to be the starting point of the vector. The vector can be read from that starting point and used as a template for setting the write weightings to 1 as explained above. If the end of the vector is reached within that training iteration, the next element can be read from the beginning of the vector. In yet another example, a 2-dimensional array of low-discrepancy sequences, such as the one generated in line #3 can be provided. Then at the start of a training iteration (e.g., for each of training iterations), a random sequence can be chosen from the array and used as a template for setting the write weightings to 1 as explained above. If the end of that sequence is reached, another random sequence can be chosen from the array.

FIG. 1 is a diagram illustrating components of a system in one embodiment. The components shown include computer-implemented components, for instance, implemented and/or run on one or more hardware processors, or coupled with one or more hardware processors. One or more hardware processors, for example, may include components such as programmable logic devices, microcontrollers, memory devices, and/or other hardware components, which may be configured to perform respective tasks described in the present disclosure. Coupled memory devices may be configured to selectively store instructions executable by one or more hardware processors. For example, a processor may be a central processing unit (CPU), a graphics processing unit (GPU), a field programmable gate array (FPGA), an application specific integrated circuit (ASIC), another suitable processing component or device, or one or more combinations thereof. The processor may be coupled with a memory device. The memory device may include random access memory (RAM), read-only memory (ROM) or another memory device, and may store data and/or processor instructions for implementing various functionalities associated with the methods and/or systems described herein. The processor may execute computer instructions stored in the memory or received from another computer device or medium.

A memory network can include a controller 102 such as an artificial neural network and a memory component 104, for example, a memory external to the neural network. The memory component is also referred to as a memory matrix. The controller 102 can access the memory 104 with read and write operations, which can be parameterized with weights (e.g., write weightings for write operations and read weightings for read operations). Training the memory network can include causing the memory network to learn the memory network's memory write weights for writing to selective locations of the memory 104, read weights for reading from selective locations of the memory 104. Read vectors are returned as combinations of row vectors in memory, determined based on the read weightings. That is, for each data instance (such as a training example), M read vectors are generated per read head where M is the width of the memory matrix.

A computer processor, e.g., shown at 106, may construct a memory network with at least memory write weightings, memory read weightings and at least one read vector. The computer processor 106 may also initialize the memory matrix 104. The memory write weightings parameterize memory write operations of a neural network, e.g., 102, to the memory matrix 104. The memory read weightings parameterize memory read operations of the neural network, e.g., 102, from the memory matrix 104. The computer processor 106 may initialize at least one of the write weightings, the read weightings or the read vectors, to be sparse or have sparsity. The computer processor 106 may train the memory network 108 with at least one of the write weightings, the read weightings or the read vectors, initialized to have a sparse characteristic. The training updates the write weightings, the read weightings and the read vector.

In an embodiment, the computer processor 106 may use a low-discrepancy sequence to generate a sparse set to apply to at least one of the write weightings, the read weightings, or elements of the at least one read vector. Examples of a low-discrepancy sequence include, but are not limited to, Sobol, Halton, Hammersley, and van der Corput sequences.

For example, in an embodiment, the computer processor 106 may set a sparse number of the write weightings to a non-zero value and set the rest of the write weightings, the read weightings and elements of at least of read vector to a zero value, to initialize at least one of the write weightings, the read weightings or the read vector, to be sparse. In an embodiment, the sparse number of write weightings, which are set to have a non-zero value, follow a pattern of a low-discrepancy sequence.

As another example, in an embodiment, the computer processor 106 may set a sparse number of read weightings to a non-zero value and set the rest of the read weightings, the writing weightings and elements of at least one read vector to have a zero value, to initialize at least one of the write weightings, the read weightings or the read vector, to have sparsity. In an embodiment, the sparse number of read weightings, which are set to non-zero, follow a pattern of a low-discrepancy sequence.

Figure 2:
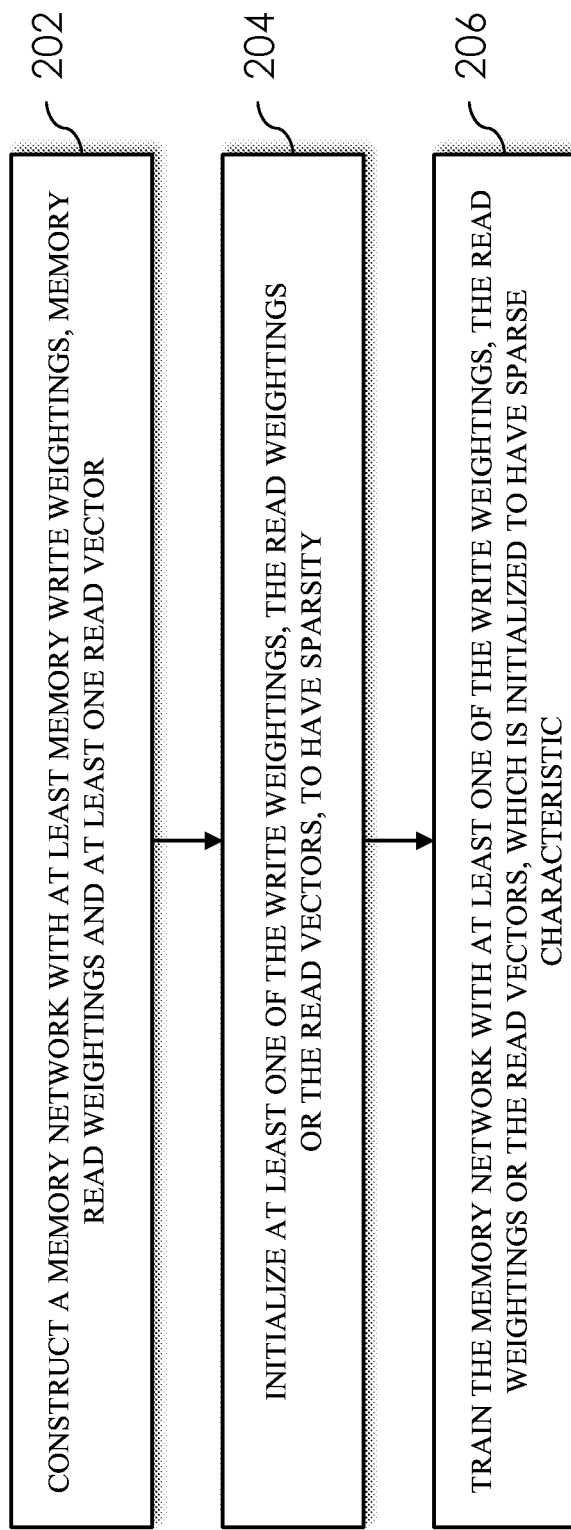
FIG. 2 is a method of training a memory network according to one embodiment.

FIG. 2 is a method of training a memory network according to one embodiment. The method can be performed or executed on a hardware processor, for example, a computer processor. At 202, the method includes constructing a memory network with at least memory write weightings, memory read weightings and at least one read vector. In an aspect, the memory write weightings parameterizing memory write operations of a neural network to an external memory component of the memory network; the memory read weightings parameterize memory read operations of the neural network from the external memory component of the memory network.

At 204, the method includes initializing at least one of the write weightings, the read weightings or the read vectors, to have sparsity. For example, the method may choose to select write weightings, reading weightings or a read vector. The selection is then initialized to have sparse characteristics. For instance, in an embodiment, the write weightings, read weightings, and elements of the read vector can be set to a first value, such as "0". Then a selected one (e.g., write weightings, read weightings or read vector) can be set to have a sparse (small) number of its elements to a second value, such as "1". Values other than "0" and "1" can be used to denote sparse characteristics. In an embodiment, the method may use a low-discrepancy sequence to generate a sparse set of values.

As an example, the method may set a sparse number of the write weightings to a non-zero value and set rest of the write weightings, the read weightings and elements of the at least one read vector to a zero value. In an embodiment, a sparse number of write weightings, which are set to a non-zero value, follow a pattern of a low-discrepancy sequence.

As another example, the method may set a sparse number of read weightings to a non-zero value and set rest of the read weightings, the writing weightings and elements of at least one read vector to have a zero value. In an embodiment, the sparse number of read weightings, which are set to non-zero, follow a pattern of a low-discrepancy sequence.

As yet another example, the method may set a sparse number of elements of the read vector to a non-zero value and set rest of the elements of the read vector, the read weightings, and the writing weightings to have a zero value. In an embodiment, the sparse number of elements of the read vector, which are set to non-zero, follow a pattern of a low-discrepancy sequence.

In an embodiment, the sparse number is 1. In another embodiment, the sparse number is more than 1, and can be less than a configurable number.

At 206, the method includes training the memory network with at least one of the write weightings, the read weightings or the read vectors, which is initialized to have sparse characteristic. The training updates the write weightings, the read weightings and the at least one read vector. The write and read weightings can be considered as connection weights between the neural network and the external memory. In an aspect, the memory network can be trained by gradient descent.

Figure 3:
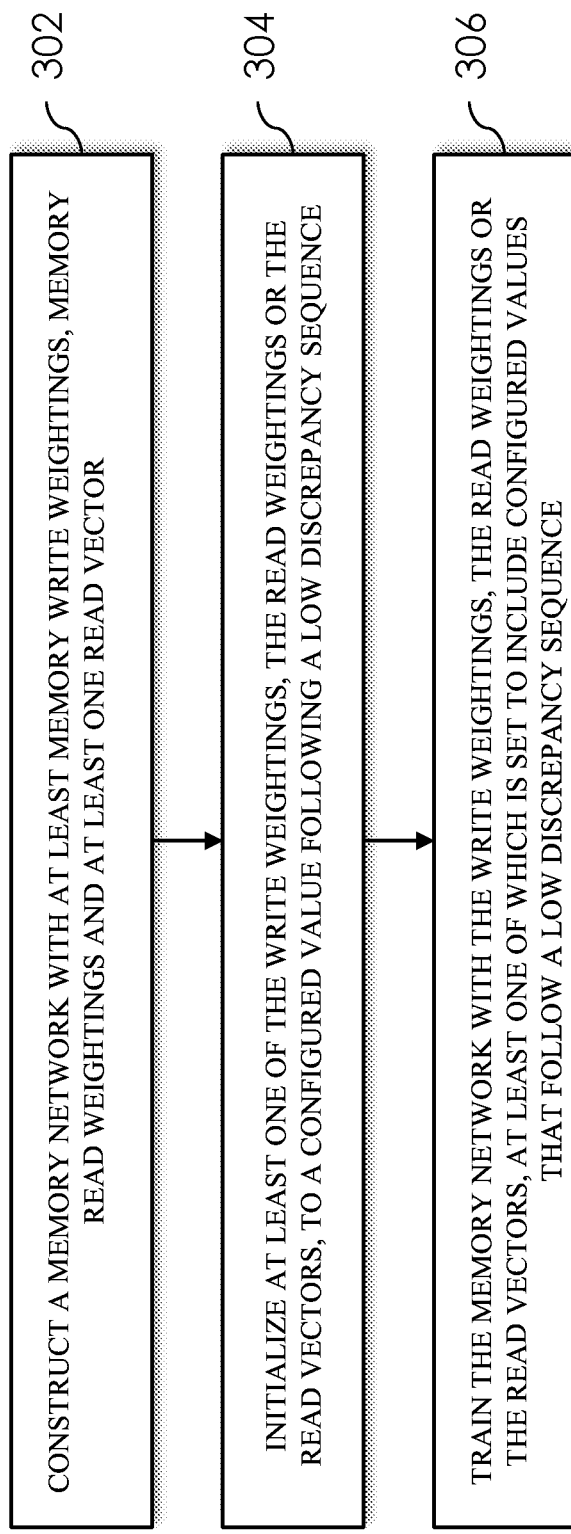
FIG. 3 is a flow diagram illustrating a method in another embodiment.

FIG. 3 is a flow diagram illustrating a method in another embodiment. The method can be performed or executed on a hardware processor, for example, a computer processor. At 302, the method may include constructing a memory network with at least memory write weightings, memory read weightings and at least one read vector. The memory write weightings parameterize memory write operations of a neural network to an external memory component of the memory network. The memory read weightings parameterize memory read operations of the neural network from the external memory component of the memory network.

At 304, the method includes initializing at least one selected from the group of at least the write weightings, the read weightings and the at least one read vector, to a configured value following a low discrepancy sequence, e.g., initialized by low-discrepancy sampling pattern. For example, the method includes selecting write weightings, read weightings, or a read vector. The method may set elements of the selection to a configured value such as a "1", which elements follow a low discrepancy sequence. Initializing also can include setting the write weightings, the read weightings and elements of the read vector, which are not selected for the low discrepancy sequence, to have a value other than the configured value. As an example, the initializing can include setting the write weightings, the read weightings and elements of the read vector, which are not selected as following the low discrepancy sequence, to have a value of zero. As yet another example, the initializing may include setting the write weightings, the read weightings and elements of the read vector, which are not selected as following the low discrepancy sequence, to have a random number other than the configured value.

At 306, the method includes training the memory network with the initialized write weightings, read weightings and read vector, at least one of which is set to include configured values that follow a low discrepancy sequence. The training updates the write weightings, the read weightings and at least one read vector. The write and read weightings can be considered as connection weights between the neural network and the external memory. In an aspect, the memory network can be trained by gradient descent.

FIG. 4 shows an example of generating Sobol sequences using Python (a computer programming language) interpreter, as an example method of generating a low-discrepancy sequence. A command of the language is shown as preceded by ">>>", and followed by the output resulting from the executed command. The first command "import sobol_seq" imports an available Sobol Sequence package. The second command outputs a matrix of 40 Sobol sequences of length $2^7-1=127$, i.e., sobol (40, 127). The third command outputs the first column of the matrix output by the second command.

Figure 5:
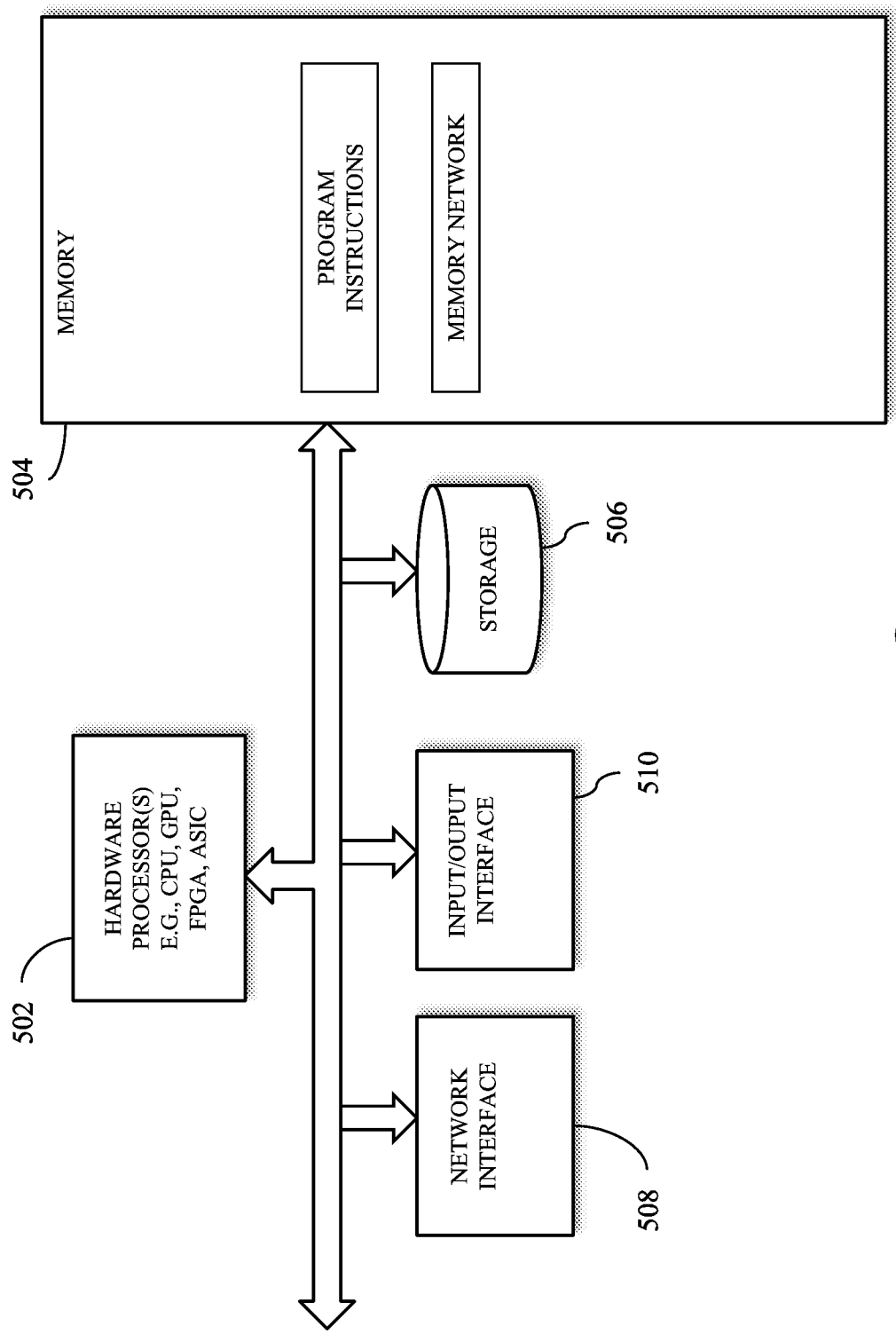
FIG. 5 is a diagram showing components of a system in one embodiment that trains a memory network.

FIG. 5 is a diagram showing components of a system in one embodiment that trains a memory network. One or more hardware processors 502 such as a central processing unit (CPU), a graphic process unit (GPU), and/or a Field Programmable Gate Array (FPGA), an application specific integrated circuit (ASIC), and/or another processor, may be coupled with a memory device 504, and architect and train a memory network. A memory device 504 may include random access memory (RAM), read-only memory (ROM) or another memory device, and may store data and/or processor instructions for implementing various functionalities associated with the methods and/or systems described herein. One or more processors 502 may execute computer instructions stored in memory 604 or received from another computer device or medium. A memory device 504 may, for example, store instructions and/or data for functioning of one or more hardware processors 502, and may include an operating system and other program of instructions and/or data. One or more hardware processors 502 may construct a memory network and initialize parameters of the memory network. For instance, one or more hardware processors 502 may initialize at least one of the write weightings, the read weightings or the read vectors, to have sparsity. In another aspect, one or more hardware processors may initialize at least one of the write weightings, the read weightings or the read vectors to a configured value following a low discrepancy sequence. Yet in another aspect, one or more hardware processors may initialize at least one of the write weightings, the read weightings or the read vectors to have sparsity and also follow a low discrepancy sequence in setting the sparse values. Input or training data can be stored in a storage device 504 or received via a network interface 508 from a remote device, and may be temporarily loaded into a memory device 504 for building or generating the trained memory network. In one aspect, the generated or trained memory network may be stored on a memory device 504, for example, for execution by one or more hardware processors 502 for performing a task. One or more hardware processors 502 may be coupled with interface devices such as a network interface 508 for communicating with remote systems, for example, via a network, and an input/output interface 510 for communicating with input and/or output devices such as a keyboard, mouse, display, and/or others.

Figure 6:
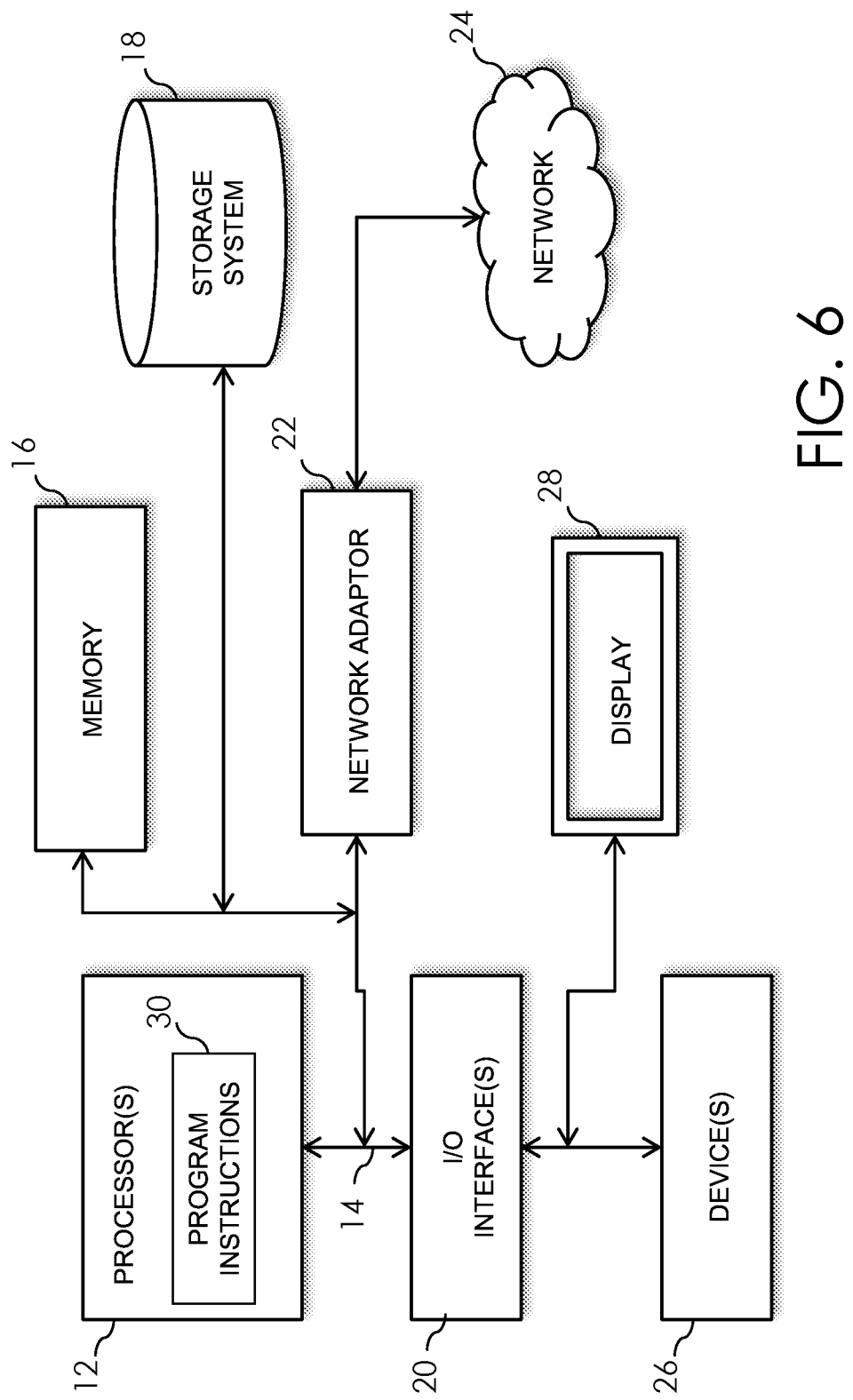
FIG. 6 illustrates a schematic of an example computer or processing system that may implement a system in one embodiment.

FIG. 6 illustrates a schematic of an example computer or processing system that may implement a system in one embodiment. The computer system is only one example of a suitable processing system and is not intended to suggest any limitation as to the scope of use or functionality of embodiments of the methodology described herein. The processing system shown may be operational with numerous other general purpose or special purpose computing system environments or configurations. Examples of well-known computing systems, environments, and/or configurations that may be suitable for use with the processing system shown in FIG. 6 may include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

The computer system may be described in the general context of computer system executable instructions, such as program modules, being executed by a computer system. Generally, program modules may include routines, programs, objects, components, logic, data structures, and so on that perform particular tasks or implement particular abstract data types. The computer system may be practiced in distributed cloud computing environments where tasks are performed by remote processing devices that are linked through a communications network. In a distributed cloud computing environment, program modules may be located in both local and remote computer system storage media including memory storage devices.

The components of computer system may include, but are not limited to, one or more processors or processing units 12, a system memory 16, and a bus 14 that couples various system components including system memory 16 to processor 12. The processor 12 may include a module 30 that performs the methods described herein. The module 30 may be programmed into the integrated circuits of the processor 12, or loaded from memory 16, storage device 18, or network 24 or combinations thereof.

Bus 14 may represent one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system may include a variety of computer system readable media. Such media may be any available media that is accessible by computer system, and it may include both volatile and non-volatile media, removable and non-removable media.

System memory 16 can include computer system readable media in the form of volatile memory, such as random access memory (RAM) and/or cache memory or others. Computer system may further include other removable/non-removable, volatile/non-volatile computer system storage media. By way of example only, storage system 18 can be provided for reading from and writing to a non-removable, non-volatile magnetic media (e.g., a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 14 by one or more data media interfaces.

Computer system may also communicate with one or more external devices 26 such as a keyboard, a pointing device, a display 28, etc.; one or more devices that enable a user to interact with computer system; and/or any devices (e.g., network card, modem, etc.) that enable computer system to communicate with one or more other computing devices. Such communication can occur via Input/Output (I/O) interfaces 20.

Still yet, computer system can communicate with one or more networks 24 such as a local area network (LAN), a general wide area network (WAN), and/or a public network (e.g., the Internet) via network adapter 22. As depicted, network adapter 22 communicates with the other components of computer system via bus 14. It should be understood that although not shown, other hardware and/or software components could be used in conjunction with computer system. Examples include, but are not limited to: microcode, device drivers, redundant processing units, external disk drive arrays, RAID systems, tape drives, and data archival storage systems, etc.

It is understood in advance that although this disclosure may include a description on cloud computing, implementation of the teachings recited herein are not limited to a cloud computing environment. Rather, embodiments of the present invention are capable of being implemented in conjunction with any other type of computing environment now known or later developed. Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 7:
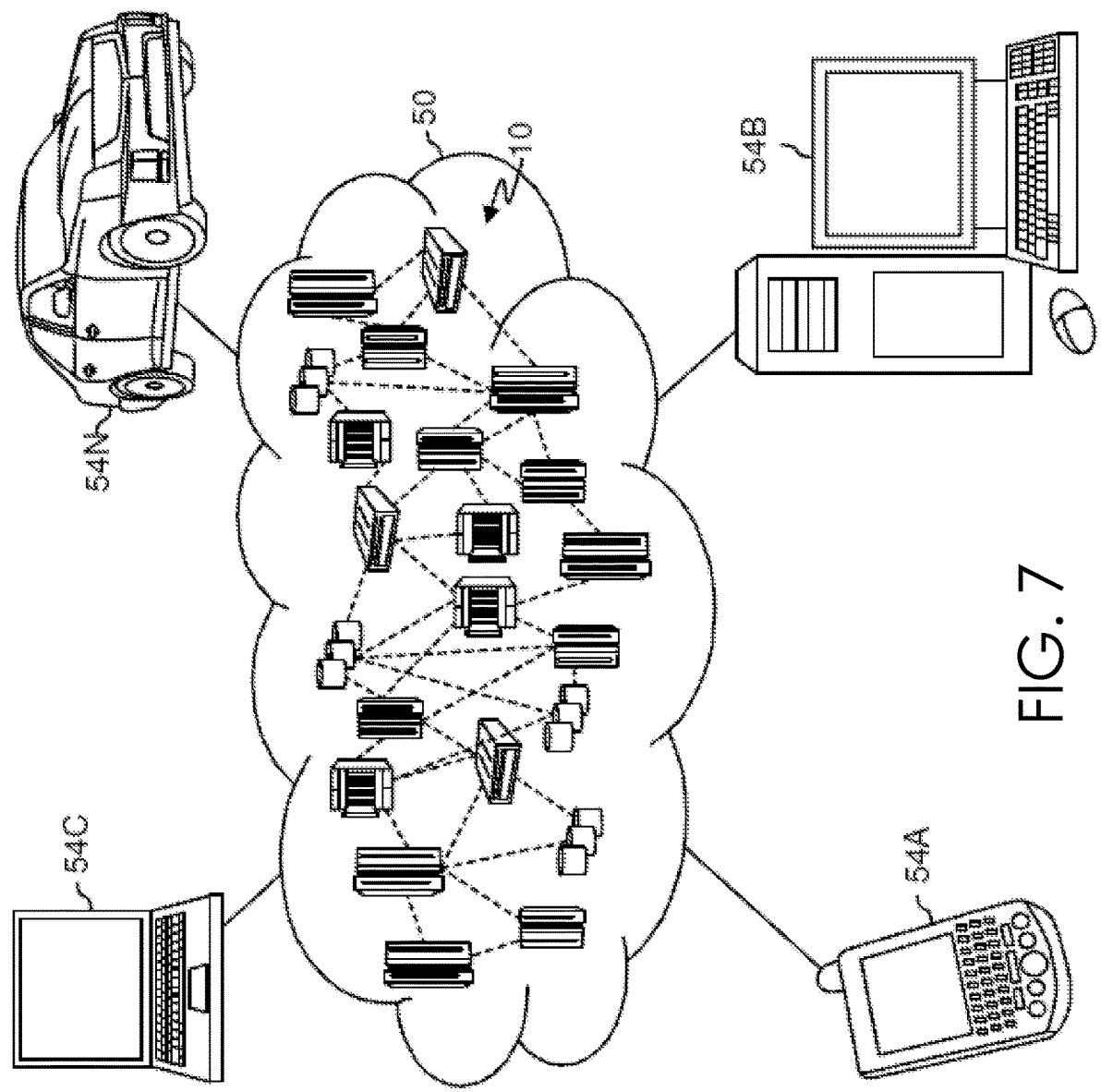
FIG. 7 illustrates a cloud computing environment in one embodiment.

Referring now to FIG. 7, illustrative cloud computing environment 50 is depicted. As shown, cloud computing environment 50 includes one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 7 are intended to be illustrative only and that computing nodes 10 and cloud computing environment 50 can communicate with any type of computerized device over any type of network and/or network addressable connection (e.g., using a web browser).

Figure 8:
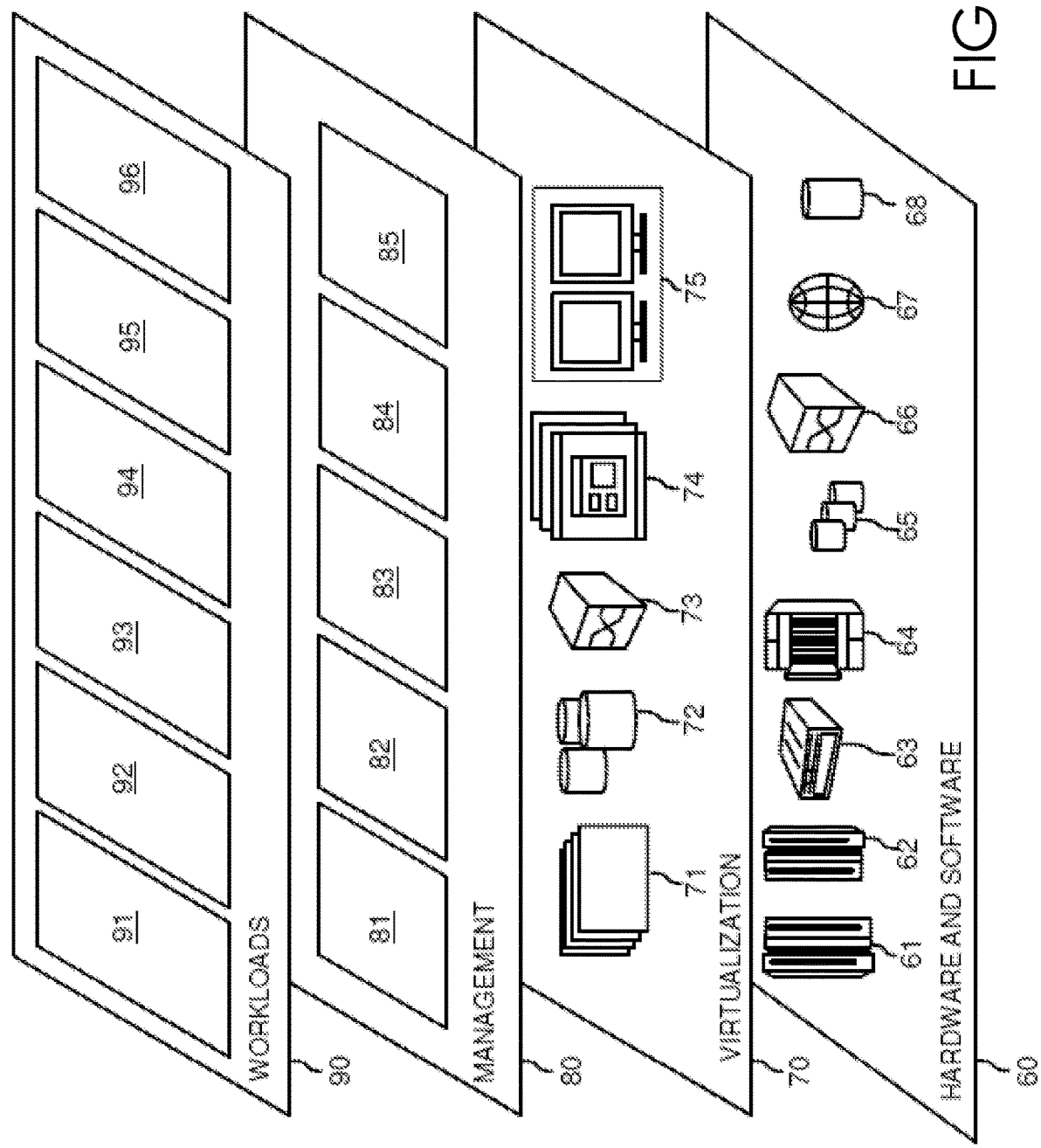
FIG. 8 illustrates a set of functional abstraction layers provided by cloud computing environment in one embodiment of the present disclosure.

Referring now to FIG. 8, a set of functional abstraction layers provided by cloud computing environment 50 (FIG. 7) is shown. It should be understood in advance that the components, layers, and functions shown in FIG. 8 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and memory network training processing 96.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. As used herein, the term "or" is an inclusive operator and can mean "and/or", unless the context explicitly or clearly indicates otherwise. It will be further understood that the terms "comprise", "comprises", "comprising", "include", "includes", "including", and/or "having," when used herein, can specify the presence of stated features, integers, steps, operations, elements, and/or components, but do not preclude the presence or addition of one or more other features, integers, steps, operations, elements, components, and/or groups thereof. As used herein, the phrase "in an embodiment" does not necessarily refer to the same embodiment, although it may. As used herein, the phrase "in one embodiment" does not necessarily refer to the same embodiment, although it may. As used herein, the phrase "in another embodiment" does not necessarily refer to a different embodiment, although it may. Further, embodiments and/or components of embodiments can be freely combined with each other unless they are mutually exclusive.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

We claim:

1. A computer-implemented method of training a memory network, comprising:
    constructing a memory network with at least memory write weightings, memory read weightings and at least one read vector, the memory write weightings parameterizing memory write operations of a neural network to an external memory component of the memory network, the memory read weightings parameterizing memory read operations of the neural network from the external memory component of the memory network;
    initializing at least one selected from the group of at least the write weightings, the read weightings, and elements of the at least one read vector, to have sparsity; and
    training the memory network with said one selected from the group of at least the write weightings, the read weightings and elements of the at least one read vector, initialized to have sparse characteristic, the training updating the write weightings, the read weightings and the at least one read vector.

2. The method of claim 1, wherein initializing said one selected from the group of the write weightings, the read weightings and elements of the at least one read vector, to have sparsity, includes setting a sparse number of the write weightings to a non-zero value and setting rest of the write weightings, the read weightings and elements of the at least one read vector to a zero value.

3. The method of claim 2, wherein the sparse number of write weightings, which are set to a non-zero value, follow a pattern of a low-discrepancy sequence.

4. The method of claim 1, wherein initializing said one selected from the group of the write weightings, the read weightings and elements of the at least one read vector, to have sparsity, includes setting a sparse number of read weightings to a non-zero value and setting rest of the read weightings, the writing weightings and elements of the at least one read vector to have a zero value.

5. The method of claim 4, wherein the sparse number of read weightings, which are set to non-zero, follow a pattern of a low-discrepancy sequence.

6. The method of claim 1, wherein initializing said one selected from the group of the write weightings, the read weightings and elements of the at least one read vector, to have sparsity, includes setting a sparse number of elements of the at least one read vector to a non-zero value and setting rest of the elements of the at least one read vector, the read weightings, and the writing weightings to have a zero value.

7. The method of claim 6, wherein the sparse number of elements of the at least one read vector, which are set to non-zero, follow a pattern of a low-discrepancy sequence.

8. The method of claim 1, further including using a low-discrepancy sequence to generate a sparse set of said one selected from the group of the write weightings, the read weightings and elements of the at least one read vector.

9. The method of claim 1, wherein the sparse number is one.

10. The method of claim 1, wherein the sparse number is greater than one.

11. A computer-implemented method of training a memory network, comprising:
    constructing a memory network with at least memory write weightings, memory read weightings and at least one read vector, the memory write weightings parameterizing memory write operations of a neural network to an external memory component of the memory network, the memory read weightings parameterizing memory read operations of the neural network from the external memory component of the memory network;

initializing at least one selected from the group of at least the write weightings, the read weightings and elements of the at least one read vector, to a configured value following a low discrepancy sequence; and training the memory network with said one selected from the group of at least the write weightings, the read weightings and elements of the at least one read vector, with initial configured values that follow a low discrepancy sequence, the training updating the write weightings, the read weightings and the at least one read vector.

12. The method of claim 11, wherein the initializing further includes setting the write weightings, the read weightings and elements of the at least one read vector, which are not selected for the low discrepancy sequence, to have a value other than the configured value.

13. The method of claim 11, wherein the initializing further includes setting the write weightings, the read weightings and elements of the at least one read vector, which are not selected as following the low discrepancy sequence, to have a value of zero.

14. The method of claim 10, wherein the initializing further includes setting the write weightings, the read weightings and elements of the at least one read vector, which are not selected as following the low discrepancy sequence, to have a random number other than the configured value.

15. A system for training a memory network, comprising:
a hardware processor;
a memory device coupled with the hardware processor, the memory device storing a memory matrix;
the hardware processor configured to at least:
construct a memory network with at least memory write weightings, memory read weightings and at least one read vector, the memory write weightings parameterizing memory write operations of a neural network to the memory matrix, the memory read weightings parameterizing memory read operations of the neural network from the memory matrix;
initialize at least one selected from the group of at least the write weightings, the read weightings and elements of the at least one read vector, to have sparsity; and
train the memory network with said one selected from the group of at least the write weightings, the read weightings and the at least one read vector, initialized to have a sparse characteristic, the training updating the write weightings, the read weightings and the at least one read vector.

16. The system of claim 15, wherein the hardware processor is configured to set a sparse number of the write weightings to a non-zero value and set rest of the write weightings, the read weightings and elements of the at least one read vector to a zero value, to initialize said one selected from the group of the write weightings, the read weightings and the at least one read vector, to have sparse characteristics.

17. The system of claim 16, wherein the sparse number of write weightings, which are set to have a non-zero value, follow a pattern of a low-discrepancy sequence.

18. The system of claim 15, wherein the hardware processor is configured to set a sparse number of read weightings to a non-zero value and set rest of the read weightings, the write weightings and elements of the at least one read vector to have a zero value, to initialize said one selected from the group of the write weightings, the read weightings and the at least one read vector, to have sparsity.

19. The system of claim 18, wherein the sparse number of read weightings, which are set to non-zero, follow a pattern of a low-discrepancy sequence.

20. The system of claim 15, wherein the hardware processor is configured to use a low-discrepancy sequence to generate a sparse set of said one selected from the group of the write weightings, the read weightings and elements of the at least one read vector.

* * * * *